(12) United States Patent
Lee et al.

(10) Patent No.: US 8,487,452 B2
(45) Date of Patent: Jul. 16, 2013

(54) SEMICONDUCTOR PACKAGE HAVING A STACKED STRUCTURE

(75) Inventors: Jin-Yang Lee, Hwaseong-si (KR);
Chan-Min Han, Hwaseong-si (KR);
Kil-Soo Kim, Hwaseong-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/175,406

(22) Filed: Jul. 1, 2011

(65) Prior Publication Data

US 2012/0001347 A1 Jan. 5, 2012

(30) Foreign Application Priority Data

Jul. 2, 2010 (KR) .................. 10-2010-0063931

(51) Int. Cl.
*H01L 23/48* (2006.01)

(52) U.S. Cl.
USPC ............ 257/777; 257/E23.141; 257/E25.006; 257/E25.013

(58) Field of Classification Search
USPC ............ 257/777, E23.141, E25.006, E25.013
See application file for complete search history.

(56) References Cited

U.S. PATENT DOCUMENTS

| 6,133,637 A * | 10/2000 | Hikita et al. ................. 257/777 |
| 7,132,753 B1 | 11/2006 | St. Amand et al. |
| 2006/0267173 A1 | 11/2006 | Takiar et al. |
| 2009/0085225 A1 | 4/2009 | Park |
| 2009/0267224 A1 * | 10/2009 | Landry et al. ................. 257/723 |
| 2010/0072604 A1 * | 3/2010 | Komatsu et al. ............. 257/691 |

FOREIGN PATENT DOCUMENTS

| JP | 2008-543059 | 11/2008 |
| KR | 10-2008-0013937 A | 2/2008 |
| KR | 10-2009-0034180 A | 4/2009 |

* cited by examiner

*Primary Examiner* — David Vu
*Assistant Examiner* — Brandon Fox
(74) *Attorney, Agent, or Firm* — Stanzione & Kim, LLP

(57) ABSTRACT

A semiconductor package includes a substrate, a first semiconductor chip stacked on the substrate and a second semiconductor chip stacked on the first semiconductor chip. In the semiconductor package, the second semiconductor chip is rotated to be stacked on the first semiconductor chip. The semiconductor package is used in an electronic system.

17 Claims, 7 Drawing Sheets

SEMICONDUCTOR PACKAGE HAVING A STACKED STRUCTURE

CROSS-REFERENCE TO RELATED APPLICATIONS

This application claims priority under 35 U.S.C. §119 to Korean Patent Application No. 10-2010-0063931 filed on Jul. 2, 2010, the disclosure of which is hereby incorporated by reference in their entirety.

BACKGROUND OF THE INVENTION

1. Field of the Invention

Embodiments of the inventive concept relate to a semiconductor package including stacked semiconductor chips and an electronic system including the semiconductor package.

2. Description of the Related Art

Semiconductor packages are configured to electrically connect a plurality of semiconductor chips with each other in a package. However, as the semiconductor chips become light and thin, the number of semiconductor chips which are stacked within the package is increased. Accordingly, due to an increase in overhang area, fabrication processes such as warpage or cracks in the semiconductor chip have caused defects thereon.

SUMMARY OF THE INVENTION

Embodiments of the inventive concept provide a semiconductor package with a high capacity memory and excellent production yield by effectively dispersing pressure when stacking a plurality of semiconductor chips.

Embodiments of the inventive concept also provide an electronic system including a semiconductor package with a high capacity memory and excellent production yield.

Additional aspects and advantages of the present general inventive concept will be set forth in part in the description which follows and, in part, will be obvious from the description, or may be learned by practice of the general inventive concepts In accordance with an feature and utilities of the inventive concept, a semiconductor package may include a substrate, a first semiconductor chip stacked on the substrate, and a second semiconductor chip stacked on the first semiconductor chip. Here, the second semiconductor chip is rotated to be stacked on the first semiconductor chip.

An internal angle formed by longitudinal directions of the first and second semiconductor chips may exceed 0 (zero) degrees and be 45 degrees or less.

The second semiconductor chip may be rotated on a line connecting centers of the first and second semiconductor chips as a rotation axis to be stacked.

Each of the first and second semiconductor chips may include a plurality of chip pads and the substrate may include a plurality of substrate pads. The chip pads of the second semiconductor chip may be connected to the chip pads of the first semiconductor chip by bonding wires and the chip pads of the first semiconductor chip may be connected to the substrate pads by bonding wires. Herein, the bonding wires may electrically connect the chip pads disposed in exposed portions of the first semiconductor chip with the chip pads of the second semiconductor chip.

In accordance with the semiconductor package of the inventive concept, the bonding wires may electrically connect the chip pads disposed in one lengthwise exposed portion of the exposed portions with the chip pads of the second semiconductor chip. In accordance with another embodiment, the bonding wires may connect the chip pads disposed in two lengthwise exposed portions of the exposed portions with the chip pads of the second semiconductor chip.

The semiconductor package may further include a third semiconductor chip stacked on the second semiconductor chip. The third semiconductor chip may be rotated to be stacked on a line connecting centers of the first to third semiconductor chips as a rotation axis in the same rotation direction as the rotation direction of the second semiconductor chip to be stacked on the first semiconductor chip.

Internal angles formed by longitudinal directions of the first to third semiconductor chips may be the same. The measures of the internal angles may exceed 0 (zero) degrees and be 45 degrees or less.

In accordance with another feature and utilities of the inventive concept, a semiconductor package includes a substrate and a plurality of semiconductor chips. The semiconductor chips are rotated on a line connecting centers of the semiconductor chips as a rotation axis to be stacked.

Internal angles formed by longitudinal directions of the first to third semiconductor chips may exceed 0 (zero) degrees and be 45 degrees or less. The semiconductor chips may be rotated to be stacked in a clockwise or counterclockwise direction.

Each of the semiconductor chips may include a plurality of chip pads and the substrate may include a plurality of substrate pads. Each of the semiconductor chips may be electrically connected to the chip pads of the semiconductor chips disposed adjacent to thereto by bonding wires and the chip pads of the semiconductor chip stacked on the substrate may be electrically connected to the substrate pads by bonding wires.

The bonding wires may electrically connect the chip pads disposed in exposed portions of the semiconductor chips and the exposed portion may be one lengthwise exposed portion or two lengthwise exposed portions.

The substrate may be one selected from the group consisting of a rigid printed circuit board (PCB), a flexible PCB, a rigid flexible PCB, a tape circuit substrate, a ceramic substrate and a combination thereof.

The substrate may further include external terminals selected from the group consisting of a solder ball, a conductive bump, a conductive tap, a conductive pin, a conductive lead and a combination thereof.

The semiconductor package may further include one or more adhesion layers selected from the group consisting of a non-conductive film (NCF), an anisotropic conductive film (ACF), a die bonding tape (DAF), a non-conductive paste (NCP) and a combination thereof between the semiconductor chips and between the substrate and the semiconductor chip stacked on the substrate. The semiconductor package may further include an encapsulant.

In accordance with still another feature and utilities of the inventive concept, an electronic system may include an input/output (I/O) device and a semiconductor package disposed adjacent to the I/O device and electrically connected to the I/O device. The semiconductor package includes a substrate and a plurality of semiconductor chips stacked on the substrate. The semiconductor chips are rotated on a line connecting the center of the semiconductor chips as a rotation axis.

Herein, internal angles formed by the longitudinal directions of the semiconductor chips may exceed 0 (zero) degrees and be 45 degrees or less.

In accordance with a feature and utilities of the inventive concept, a semiconductor package may include a substrate, a first semiconductor chip stacked on the substrate and having a first shape, and a second semiconductor chip stacked on the first semiconductor chip and having a second shape. An overlap area may be formed between the first semiconductor chip and the second semiconductor chip such that a shape of the overlap area has a shape different from the first shape of the first semiconductor chip and the second shape of second semiconductor chip.

At least one of the first shape and the second shape may be a rectangular shape, and the shape of the overlap area may not be a rectangular shape.

The first semiconductor chip may include first pads, the second semiconductor chip may include second pads, and the first pads and the second pads may be disposed on an area different from the overlap area.

In accordance with a feature and utilities of the inventive concept, a semiconductor chip usable in a semiconductor package may include an internal circuit having a length in a direction, one or more conductive lines formed on the internal circuit, and one or more pads formed in a pad area having a length in the direction and connected to the corresponding conductive lines, wherein the length of the pad area of the pads may be shorter than the length of the internal circuit in the direction.

In accordance with a feature and utilities of the inventive concept, a semiconductor package may include a substrate having one or more substrate pads, and a semiconductor chip disposed on the substrate. The semiconductor chip may include an internal circuit having a length in a direction, one or more conductive lines formed on the internal circuit, and one or more pads formed in a pad area having a length in the direction and connected to the corresponding conductive lines to be connected to the corresponding substrate pads, wherein the length of the pad area of the pads may be shorter than the length of the internal circuit in the direction.

In accordance with a feature and utilities of the inventive concept, a semiconductor package may include a first semiconductor chip, and a second semiconductor chip disposed on the first semiconductor chip, and electrically connected to the first semiconductor chip, wherein each of the first semiconductor chip and the second semiconductor chip may include an internal circuit having a length in a direction, one or more conductive lines formed on the internal circuit, and one or more pads formed in a pad area having a length in the direction, wherein the length of the pad area of the pads may be shorter than the length of the internal circuit in the direction, and wherein the pads of the pad area of the first semiconductor chip may be connected to the corresponding pads of the pad area of the second semiconductor chip.

In accordance with a feature and utilities of the inventive concept, an electronic apparatus may include a function unit to perform an operation of the apparatus, a semiconductor package to store data, and a controller to control the function unit and the semiconductor chip to process the data, wherein the semiconductor package may include a substrate, a first semiconductor chip stacked on the substrate, and a second semiconductor chip stacked on the first semiconductor chip, wherein the second semiconductor chip may be rotated to be stacked on the first semiconductor chip.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE PREFERRED EMBODIMENTS

Figure 1:
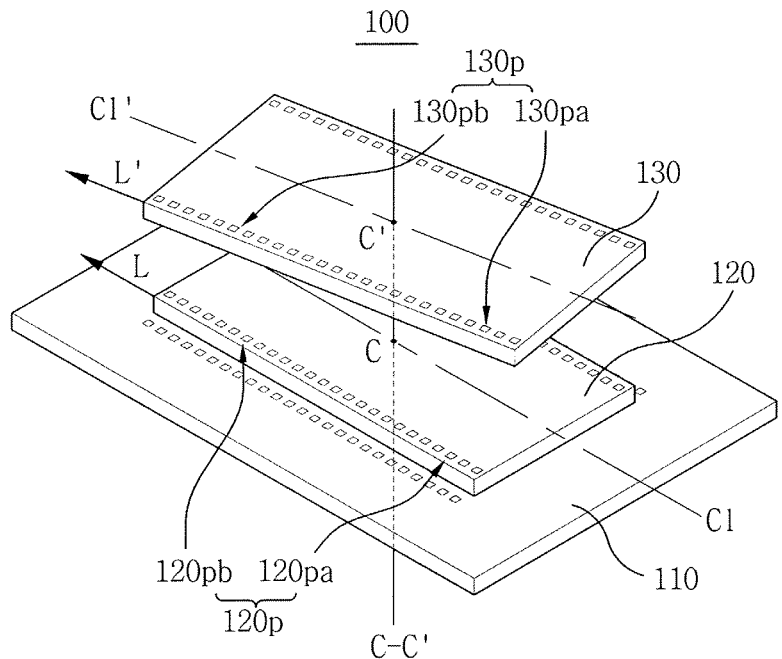
FIG. 1 is a perspective view of a semiconductor package in accordance with an embodiment of the inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
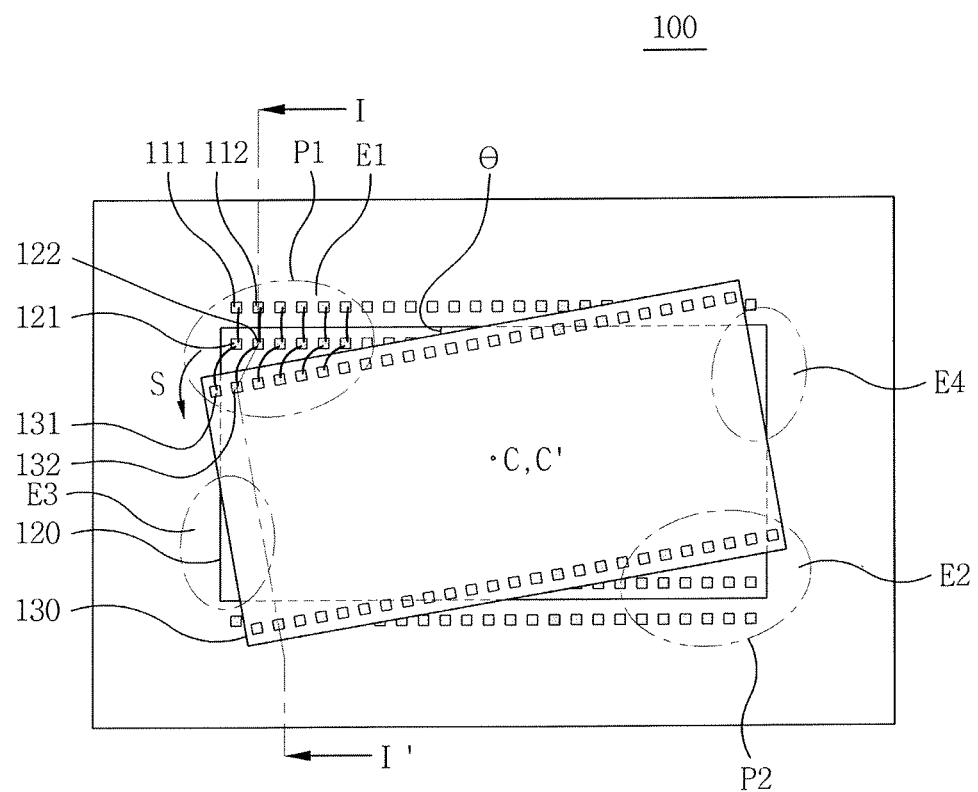
FIG. 2 is a plan view of the semiconductor package of FIG. 1 in accordance with the embodiment of the inventive concept.
Figure 3A:
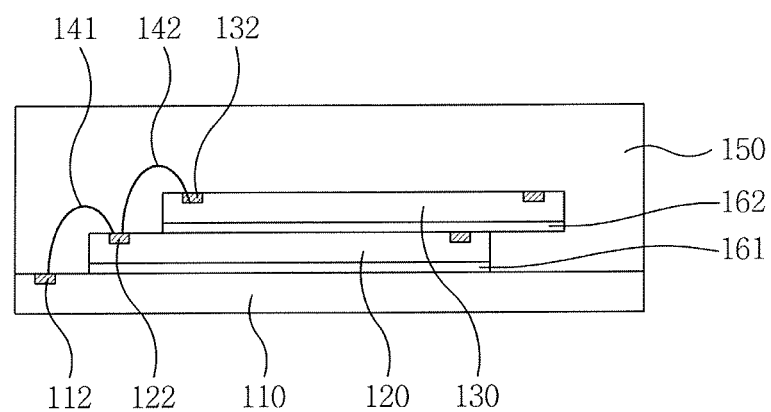
FIGS. 3A and 3B are cross-sectional views of the semiconductor package taken along line I-I' of FIG. 2.
Figure 3B:
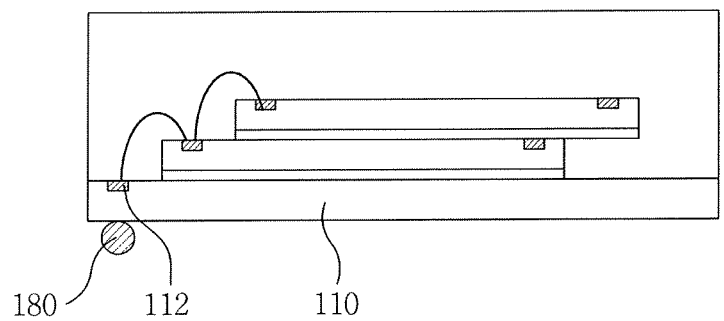

FIG. 1 is a schematic perspective view of the inside of a semiconductor package in accordance with an embodiment of the inventive concept, FIG. 2 is a plan view of the semiconductor package of FIG. 1, and FIGS. 3A and 3B are cross-sectional views taken along line I-I' of FIG. 2.

Referring to FIG. 1, a semiconductor package 100 may include a substrate 110, a first semiconductor chip 120, and a second semiconductor chip 130. The first semiconductor chip 120 is stacked on the substrate 110 and the second semiconductor chip 130 is stacked on the first semiconductor chip. For clarity, although FIG. 1 illustrates that a gap is shown or provided between the first semiconductor chip 120 and the second semiconductor chip 130, an intermediate layer, such as an adhesion layer, may be interposed therein to prevent the gap therebetween.

Here, the second semiconductor chip 130 is rotated by an angle with respect to a rotation axis, for example, a virtual center axis C-C' which connects a center C of the first semiconductor chip 120 with a center C' of the second semiconductor chip 130. The virtual center axis C-C' connecting the centers C and C' may be a stack direction of the semiconductor chips 120 and 130, i.e., a direction perpendicular to the substrate 110.

The semiconductor chips 120 and 130 may have longitudinal directions corresponding to directions of lengthwise sides thereof with respect to a major surface of the substrate 110 which is parallel to major surfaces of the semiconductor chips 120 and 130. Referring to FIG. 1, for example, if the stacked semiconductor chips 120 and 130 are rectangular parallelepipeds (hexahedrons), the longitudinal direction of the first semiconductor chip 120 may be a direction L and the longitudinal direction of the second semiconductor chip 130 may be a direction L'.

The directions L and L' of the first and second semiconductor chips 120 and 130 may be directions on which pads 120p and 130P are disposed, respectively. The pads 120p may include one or more pads 120pa which are electrically connected to the substrate 110 or the second semiconductor chip 130, and one or more pads 120pb which are not electrically connected to the substrate 110 or the second semiconductor chip 130. The pads 130p may include one or more pads 130pa which are electrically connected to the substrate 110 or the first semiconductor chip 120, and one or more pads 130pb which are not electrically connected to the substrate 110 or the first semiconductor chip 130

The one or more pads 120pa are electrically connected to corresponding internal terminals of an internal circuit (or a memory unit) of the first semiconductor chip 120 to receive and transmit data (or signal). The one or more pads 130a are also electrically connected to corresponding internal terminals of an internal circuit (or a memory unit) of the second semiconductor chip 130 to receive and transmit data (or signal).

It is possible that the one or more pads 120pb and the one or more pads 130pb may be dummy pads which are not electrically connected to the internal terminals of the internal circuit (or memory unit) thereof to receive and transmit data (or signal). However, the present general inventive concept is not limited thereto. It is possible that although the one or more pads 120pb and the one or more pads 130pb are connected to the internal terminals, the electrical connection among the substrate 110, the first semiconductor chip 120 and the second semiconductor chip 130 can be achieved by connecting the one or more pads 120pa and the 130pa and the substrate 110 without connecting the one or more pads 120pb and 130pb and the substrate 110.

The directions L and L' of the first and second semiconductor chips 120 and 130 may be directions of central axes Cl and Cl' of the first and second semiconductor chips 120 and 130, respectively. The central axis Cl of the first semiconductor chip 120 may correspond to an axis of the substrate 110, and the central axis Cl' of the second semiconductor chip 130 may be disposed to form an angle with the central axis Cl of the first semiconductor chip 120. That is, the central axis Cl' of the second semiconductor chip 130 may not be parallel to the central axis C1' of the first semiconductor chip 120 or the axis of substrate 110.

The substrate 110 and the first semiconductor chip 120 may have a common area where the first semiconductor chip 120 is disposed on the substrate 110, and the first semiconductor chip 120 and the second semiconductor chip 130 may have another common area where the second semiconductor chip 130 is disposed on the first semiconductor chip 120. The common area of the substrate 110 and the first semiconductor chip 120 may have the same area or shape of the first semiconductor chip 120. However, the present general inventive concept is not limited thereto. For example, the common area may be different from the area or shape of the first semiconductor chip 120. The another common area of the first semiconductor chip 120 and the second semiconductor chip 130 may not be the same area or shape of the first major surface of the first semiconductor chip 120 or the second major surface of the second semiconductor chip 130.

Accordingly, the first major surface of the first semiconductor chip 120 or the second major surface of the second semiconductor chip 130 may be larger than the another common area. The first major surface of the first semiconductor chip 120 or the second major surface of the second semiconductor chip 130 may include an overlap area which corresponds to the another common area, and a non-overlap area which does not correspond to the another common area.

The non-overlap area of the second semiconductor chip 130 may be disposed to face the substrate 110 or may be spaced apart from the substrate 110 by a distance corresponding to, for example, at least a thickness of the first semiconductor chip 120 in the direction of the virtual center axis C-C'. It is possible that the overlap area may be larger than the non-overlap area.

Referring to FIGS. 1 and 2, the second semiconductor chip 130 may be rotated with respect to the first semiconductor chip 120 about a rotation axis where the first and second semiconductor chips 120 and 130 are stacked. The rotation axis may correspond to the virtual center axis C-C' which connects the centers of the first and second semiconductor chips 120 and 130. An internal angle θ may be formed by the longitudinal direction L of the first semiconductor chip 120 and the longitudinal direction L' of the second semiconductor chip 130. The internal angle θ may be greater than 0 (zero) and may be 45 degrees or less. However, the present general inventive concept is not limited thereto. The internal angle θ may be greater than 45 degrees. The above-described rotation of the second semiconductor chip 130 with respect to the first semiconductor chip 120 is referred to as spin stacking.

If the internal angle is 0 (zero), chip pads disposed on each of the facing major surfaces of the semiconductor chips 120 and 130 may not be electrically connected by bonding wires (not shown). On the other hand, if the internal angle θ formed by the longitudinal directions exceeds 45 degrees, an area of a portion of the second semiconductor chip 130 which is not supported by the first semiconductor chip 120, that is, an area of an overhang portion thereof, is increased. Thus, the pressure applied to the second semiconductor chip 130 may not be effectively dispersed into the first semiconductor chip 120 while forming the bonding wires. Further, as the internal angle θ formed by the longitudinal directions L and L' increases, lengths of the bonding wires which connect the chip pads of the first semiconductor chip 120 with the chip pads of the second semiconductor chip 130 are lengthened. Accordingly, the internal angle θ may be set according to the number of chip pads of the semiconductor chips using the bonding wires. However, a method of electrically connecting the first and second semiconductor chips 120 and 130 is not limited to the bonding wires. That is, the inventive concept may include a flip chip connection method which forms conductive bumps on the semiconductor chips and directly bonds the conductive bumps on portions of a connection subject. However, hereinafter, the wire bonding method will be exemplified for clarity.

FIG. 2 is a plan view of the semiconductor package 100 of FIG. 1. The semiconductor package 100 may include the first semiconductor chip 120 and the second semiconductor chip 130 stacked on the substrate 110. In particular, the second semiconductor chip 130 may be rotated by the angle θ on a virtual center axis which connects the centers C and C' of the semiconductor chips 120 and 130 with respect to a rotation axis in a clockwise or counterclockwise direction to be stacked on the first semiconductor chip 120. FIG. 2 illustrates the second semiconductor chip 130 rotated in the counterclockwise direction S to be stacked.

In FIG. 2, the first semiconductor chip 120 and the second semiconductor chip 130 may be stacked such that the center C of the first semiconductor chip 120 and the center C' of the second semiconductor chip 130 overlap as a common center. The virtual center axis connecting the centers C and C' may be a direction extending upward from the surface of the substrate 110 and may be perpendicular to the major surfaces of the substrate 110, the first semiconductor chip 120, and the second semiconductor chip 130. The angle θ is an internal angle formed by the longitudinal direction of the first semiconductor chip 120 and the longitudinal direction of the second semiconductor chip 130.

The first semiconductor chip 120 includes a plurality of chip pads 121 and 122 disposed along edges of an upper surface of the first semiconductor chip 120. Similarly, the second semiconductor chip 130 includes a plurality of chip pads 131 and 132 disposed along edges of an upper surface of the second semiconductor chip 130. FIG. 2 illustrates the chip pads 121, 122, 131, and 132 disposed on lengthwise edges of the first and second semiconductor chips 120 and 130, respectively, as illustrated in FIG. 2. The chip pads 121, 122, 131, and 132 are formed of a conductive material. For example, the chip pads 121, 122, 131 and 132 may be formed of a metal such as Au, Ag, Cu, Ni, Al, Sn, Pb, Pt, Bi and/or In.

The substrate 110 may include a plurality of substrate pads 111 and 112 on an upper surface thereof. The substrate pads 111 and 112 may be disposed along edges of the substrate 110. FIG. 2 illustrates the substrate pads 111 and 112 disposed on one sides of lengthwise edges of the substrate 110. The substrate pads 111 and 112 may be terminals to input/output electrical signals to/from an electrical circuit (not illustrated) disposed on the substrate 110 and may be formed of a conductive material. The substrate pads 111 and 112 may be formed of metal such as Au, Ag, Cu, Ni, Al, Sn, Pb, Pt, Bi and/or In.

The first semiconductor chip 120 may be stacked in the same direction as the substrate 110. The second semiconductor chip 130 may be rotated about a rotation axis, for example, the virtual axis connecting the center C of the first semiconductor chip 120 with the center C' of the second semiconductor chip 130 to be stacked such that the internal angle θ formed by the longitudinal direction of the first semiconductor chip 120 and the longitudinal direction of the second semiconductor chip 130 exceeds 0 (zero) degrees and is 45 degrees or less.

Four exposed portions E1, E2, E3, and E4 including P1 and P2 are formed on the corresponding edges (sides or corners) of the first semiconductor chip 120 by spin stacking the second semiconductor chip 130 with respect to the first semiconductor chip 120. The spin stacking indicates that the second semiconductor chip 130 is rotated with respect to the first semiconductor chip 120 to expose the portions E1, E2, E3, and E4 of the first semiconductor chip 120. The exposed portions are indicated by circles in FIG. 2. Two lengthwise exposed portions E1 and E2 which expose one or more chip pads disposed on lengthwise edges of the upper surface of the first semiconductor chip 120 are indicated by P1 and P2. Here, the lengthwise edges may be referred to a direction along where the exposed chip pads are arranged or disposed. If the semiconductor chips 120 and 130 are rectangular parallelepipeds, exposed portions which expose a certain number of the chip pads 121 and 122 of the first semiconductor chip 120 become the lengthwise exposed portions P1 and P2. The first semiconductor chip 120 may be electrically connected with the chip pads 131 and 132 of the second semiconductor chip 130 may also be electrically connected with the substrate chip pads 111 and 112 via the chip pads 121 and 122 disposed on the lengthwise exposed portions P1 and P2.

The embodiment of the inventive concept provides a semiconductor package in which the bonding wires may be formed in one exposed portion P1 of the lengthwise exposed portions P1 and P2.

The substrate 110 may include a rigid printed circuit board (PCB), a flexible PCB, a rigid flexible PCB, and/or a combination thereof such as a PCB, a tape circuit substrate, a ceramic substrate, etc.

The first semiconductor chip 120 and the second semiconductor chip 130 may include a flash memory chip, a phase change memory chip, a magnetic random access memory chip (MRAM), a resistive memory chip or a combination thereof.

Referring to FIGS. 3A and 3B, the semiconductor package 100 may further include an encapsulant 150 therein. The encapsulant 150 may be a molding unit. The encapsulant 150 protects the first semiconductor chip 1200 and the second semiconductor chip 130 as well as bonding wires from an external shock. For example, the encapsulant 150 may include an epoxy molding compound (EMC). The encapsulant 150 may be formed by a conventional injection molding process.

Each of the first and second semiconductor chips 120 and 130 is electrically connected via the chip pads 121, 122, 131, and 132 disposed on the lengthwise edges. For example, the first chip pad 121 of the first semiconductor chip 120 may be electrically connected to the first chip pad 131 of the second semiconductor chip 130. Similarly, the second chip pad 122 of the first semiconductor chip 120 may be electrically connected to the second chip pad 132 of the second semiconductor chip 130.

Furthermore, the first semiconductor chip 120 is electrically connected to the substrate 110 disposed adjacent to a lower portion thereof. As described above, the substrate pads 111 and 112 are disposed along the edges of the substrate 110 corresponding to a side (edge) of the first semiconductor chip 120. For example, the first chip pads 121 of the semiconductor chip 120 may be electrically connected to the first substrate pads 111 disposed on the substrate 110 and the second chip pads 122 of the first semiconductor chip 120 may be electrically connected to the second substrate pads 112 disposed on the substrate 110.

FIGS. 3A and 3B are cross-sectional views taken along line I-I' of FIG. 2. In FIG. 3A, the semiconductor package 100 includes the substrate 110 and the first and second semiconductor chips 120 and 130 sequentially stacked on the substrate 110. The second semiconductor chip 130 is rotated to be stacked as described above. Electrical connection between the substrate 110 and the first semiconductor chip 120 and between the first and second semiconductor chips 120 and 130 may be formed using bonding wires. Referring to FIG. 3A, the second substrate pads 112 and the second chip pads 122 of the first semiconductor chip 120 are electrically connected by first bonding wires 141. The second chip pads 122 of the first semiconductor chip 120 and the second chip pads 132 of the second semiconductor chip 130 are electrically connected by second bonding wires 142.

The first and second bonding wires 141 and 142 may be formed of Au or Al.

A first adhesion layer 161 may be included between the first semiconductor chip 120 and the substrate 110. Similarly, a second adhesion layer 162 may be included between the second semiconductor chip 130 ad the first semiconductor chip 120. The first and second adhesion layers 161 and 162 may include a non-conductive film (NCF), an anisotropic conductive film (ACF), a die attach film (DAF), a non-conductive paste (NCP) or a combination thereof.

FIG. 3B illustrates that the semiconductor package according to the inventive concept further includes one or more external terminals 180. The external terminals 180 of the substrate 110 may include a solder ball, a conductive bump, a conductive tap, a conductive pin a conductive lead and a combination thereof, for example. The external terminals 180 may receive signals from an outside of the semiconductor package 100 or output processed signals to the outside thereof. FIG. 3B illustrates solder balls as the external terminals 180. The external terminals 180 may be disposed at an interval so as to correspond to the substrate pads 112. The interval may be a constant interval.

Second Embodiment

Figure 4:
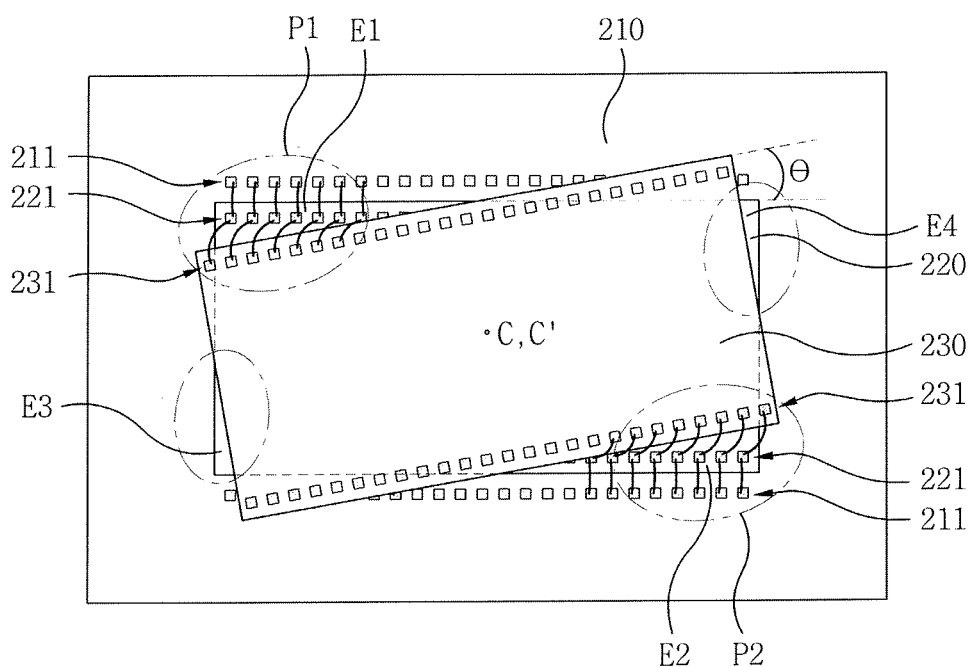
FIG. 4 is a plan view of a semiconductor package in accordance with another embodiment of the inventive concept.

FIG. 4 is a cross-sectional view of a semiconductor package according to another embodiment of the present general inventive concept. Referring to FIG. 4, a semiconductor package 200 may include a substrate 210, a first semiconductor chip 220 stacked on the substrate 210 and a second semiconductor chip 230 stacked on the first semiconductor chip 220. The first semiconductor chip 220 is stacked on the substrate 210. The second semiconductor chip 230 is stacked on the first semiconductor chip 220.

Herein, the second semiconductor chip 230 is rotated by an angle about a rotation axis, for example, a virtual center axis C-C' which connects a center C of the first semiconductor chip 220 and a center C' of the second semiconductor chip 230 to be stacked on the first semiconductor chip 220. The virtual center axis C-C' connecting the centers C and C' may be a stack direction of the semiconductor chips 220 and 230 and may be perpendicular to the substrate 210. As illustrated in FIG. 4, the first semiconductor chip 220 and the second semiconductor chip 230 may be stacked such that the center C of the first semiconductor chip 220 and the center C' of the second semiconductor chip 230 overlap as a common center. The virtual center axis C-C' connecting the centers C and C' may be a direction extending upward from the surface of the substrate 210 and may be perpendicular to major surfaces of the substrate 210 and the first and second semiconductor chips 220 and 230. An angle θ is an internal angle formed by longitudinal directions of the first and second semiconductor chips 220 and 230.

Here, the internal angle θ formed by the longitudinal directions of the first and second semiconductor chips 220 and 230 may be greater than 0 (zero) degrees and be 45 degrees or less. FIG. 4 illustrates that the second semiconductor chip 230 is rotated by the angle θ in a counterclockwise direction to be stacked with respect to the first semiconductor chip 220.

Four exposed portions E1, E2, E3, and E4 are formed on the first semiconductor chip 220 by spin stacking of the second semiconductor chip 230 with respect to the first semiconductor chip 220 as illustrated in FIG. 4 which is similar to FIG. 2. The circled portions are lengthwise exposed portions P1 and P2 among the four exposed portions E1, E2, E3, and E4. According to this embodiment of FIG. 4, all the chip pads 221 of the semiconductor chip 220 disposed on the two lengthwise exposed portions P1 and P2 may be used for electrical connection with the second semiconductor chip 230 and the substrate 210. That is, the chip pads 221 disposed along edges (sides or corners) of an upper surface of the first semiconductor chip 220 are connected to the chip pads 231 of the second semiconductor chip 230 and the substrate pads 211 by bonding wires.

If the semiconductor package 200 requires a relatively large number of terminals to input/output electrical signals to/from the substrate, the inventive concept may be embodied by connecting the chip pads and the substrate pads by bonding wires via the exposed portions of both sides as illustrated in FIG. 4. If the semiconductor package 100 requires a relatively small number of terminals to input/output electrical signals to/from the substrate, the chip pads and the substrate pads are connected by bonding wires via the exposed portion of one side as illustrated in FIG. 2, which may be advantageous in the fabrication process.

The structures and materials of the substrate pads and the chip pads, the types of the semiconductor chips, the formation and materials of the encapsulant, the adhesion layer, and the bonding wires are the same as described in the embodiment of FIGS. 2, 3A and 3B.

Figure 5:
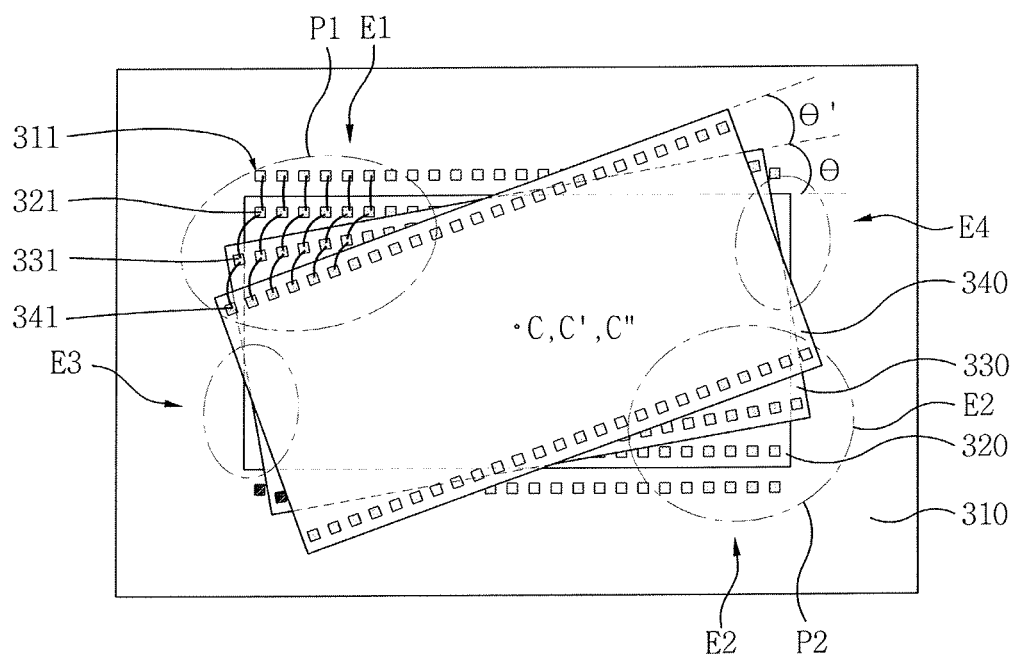
FIGS. 5 and 6 are plan views of semiconductor packages in accordance with still another embodiment of the inventive concept.
Figure 6:
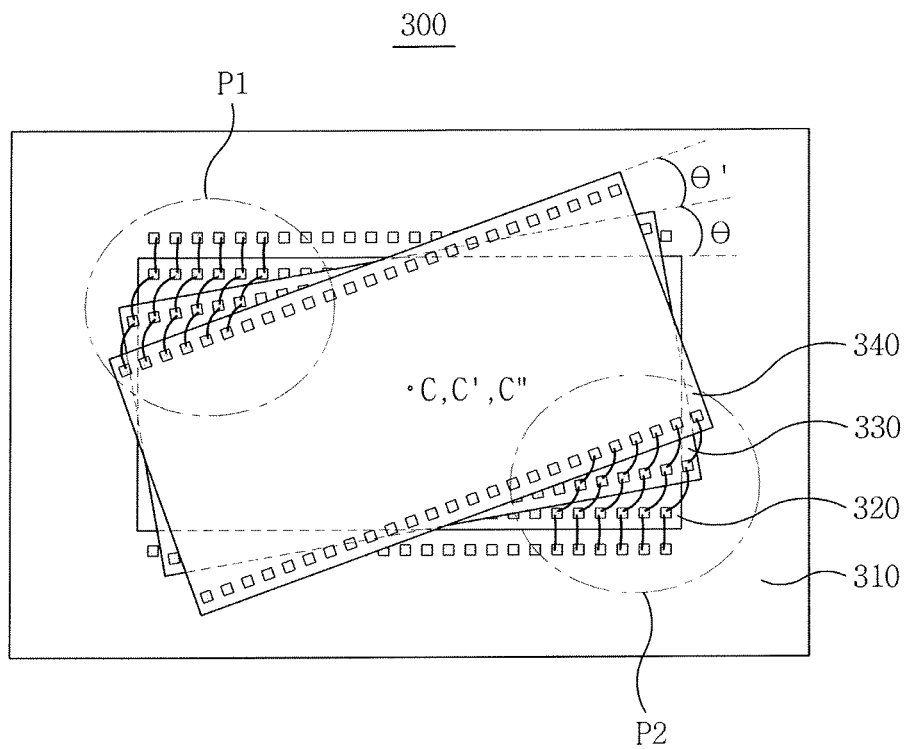
Figure 7:
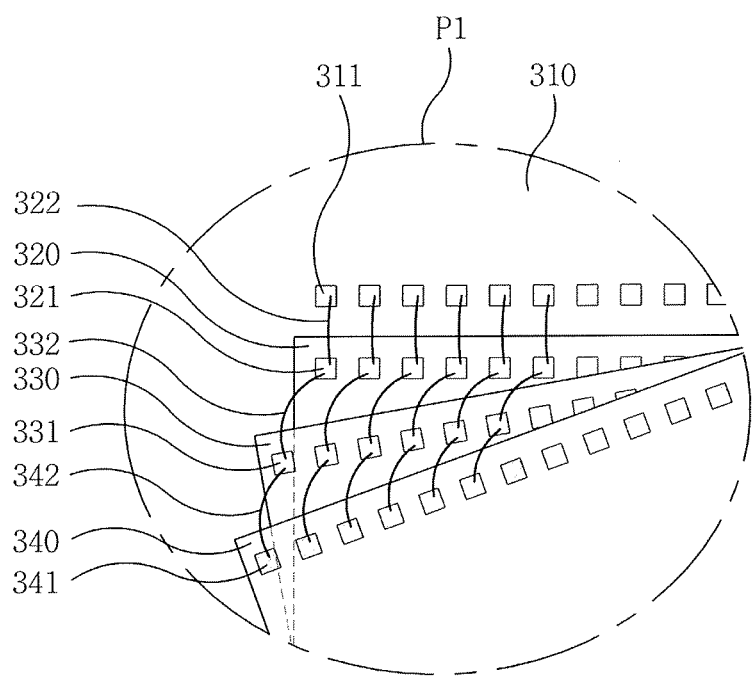
FIG. 7 is an enlarged plan view of a portion P1 of FIGS. 5 and 6.

FIG. 5 is a plan view of a semiconductor package 300 according to one embodiment of the inventive concept and FIG. 6 is a plan view of a semiconductor package according to another embodiment of the inventive concept. FIG. 7 is an enlarged plan view of a portion P1 in FIGS. 5 and 6.

Referring to FIGS. 5 and 6, a semiconductor package 300 may include a substrate 310, a first semiconductor chip 310 stacked on the substrate 310, a second semiconductor chip 330 stacked on the first semiconductor chip 320, and a third semiconductor chip 340 stacked on the second semiconductor chip 330.

The first semiconductor chip 320 may be stacked parallel to the substrate 310 with respect to major surfaces thereof. The second semiconductor chip 330 and the third semiconductor chip 340 may be rotated about a rotation axis, for example, a virtual center axis which connects the centers of the first to third semiconductor chips 320, 330 and 340 to be stacked. That is, supposing that the centers of the first to third semiconductor chips 320, 330 and 340 are C, C' and C'' respectively, the centers C, C' and C'' may form a straight line and the straight line is perpendicular to the major surface of the substrate 310. Herein, the second semiconductor chip 330 is rotated on a straight line C-C'' as the rotation axis to be stacked. The second semiconductor chip 330 may be rotated by an angle θ, which is an internal angle between a longitudinal direction of the semiconductor chip 320 and a longitudinal direction of the second semiconductor chip 330, to be stacked. Similarly, the third semiconductor chip 340 may be stacked such that an angle of the longitudinal directions thereof becomes another angle θ' on the basis of the second semiconductor chip 330. The internal angles θ and θ' may exceed 0 (zero) degrees and be 45 degrees or less. It is possible that the measures θ and θ' may be identical.

Although the semiconductor packages 300 of FIGS. 5 and 6 illustrate that the second and third semiconductor chips 330 and 340 are rotated by the angle θ in a counterclockwise direction to be stacked with respect to the substrate 310, the semiconductor chips 320, 330 and 340 may be rotated in a clockwise direction with respect to the substrate 310.

Meanwhile, each of the first and second semiconductor chips 320 and 330 includes four portions E1, E2, E3, and E4 exposed by spin stacking the first and second semiconductor chips 320 and 330 with respect to the substrate 310 and the first semiconductor chip 330, respectively. Two lengthwise exposed portions E1 and E2 corresponding to P1 and P2 which expose a number of chip pads disposed on lengthwise edges (or corners) of an upper surface of the first and second semiconductor chips 320 and 330 are indicated by circles. The semiconductor chips 320, 330 and 340 may be electrically connected to each other or the semiconductor chip 310 and the substrate 310 may be electrically connected by the chip pads 321, 331 and 341 disposed on the lengthwise exposed portions P1 and P2 and the substrate pads 311.

The bonding wires may be formed on one exposed portion P1 of the lengthwise exposed portions P1 and P2 or on all the lengthwise exposed portions P1 and P2. FIG. 5 illustrates the semiconductor package 300 in which the chip pads disposed on the exposed portion P1 of the two lengthwise exposed portions P1 and P2 are electrically connected by the bonding wires and FIG. 6 illustrates the semiconductor package 300 in which the chip pads disposed on the two lengthwise exposed portions P1 and P2 are electrically connected by the bonding wires.

Referring to FIG. 7, connections of the pads by the bonding wires in the lengthwise exposed portion P1 are enlarged to be illustrated. The substrate 310 includes substrate pads 311 formed of a conductive material. The first and third semiconductor chips 320, 330 and 340 include chip pads 321, 331 and 341 formed of a conductive material, respectively. The chip pads 341 of the third semiconductor chip 340 are electrically connected to the chip pads 331 of the second semiconductor chip 330 by third bonding wires 342. The chip pads 331 of the second semiconductor chip 330 are electrically connected to the chip pads 321 of the first semiconductor chip 320 by second bonding wires 332, and the chip pads 322 of the first semiconductor chip 320 are electrically connected to the substrate pads 311 of the substrate 310 by first bonding wires 32.

The structures and materials of the substrate pads and the chip pads, the types of the semiconductor chips, and the formation and materials of the encapsulant, the adhesion layer and the bonding wires are the same as described in the embodiment of FIGS. 2, 3A, and 3B.

Figure 8:
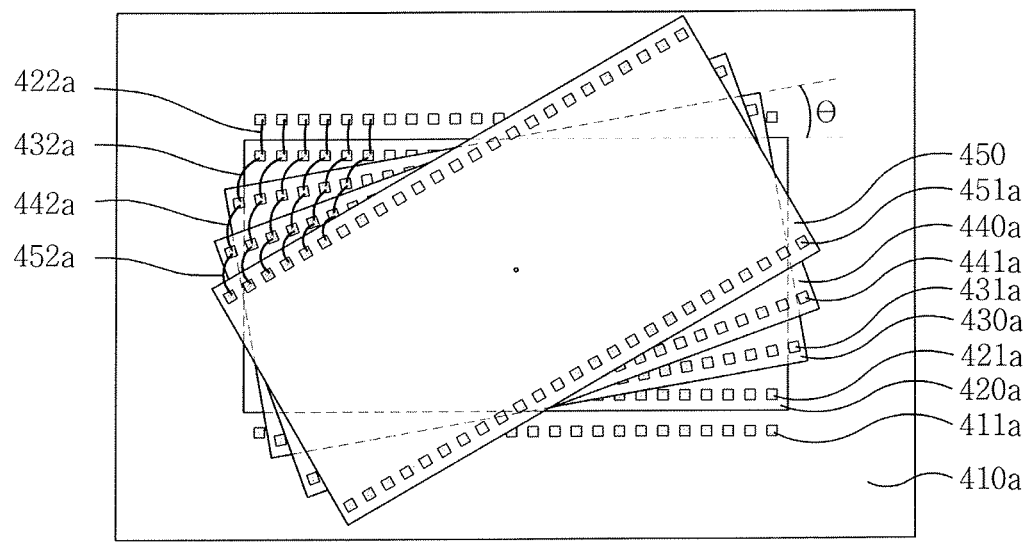
FIGS. 8 and 9 are plan views of semiconductor packages of in accordance with yet another embodiment of the inventive concept.
Figure 9:
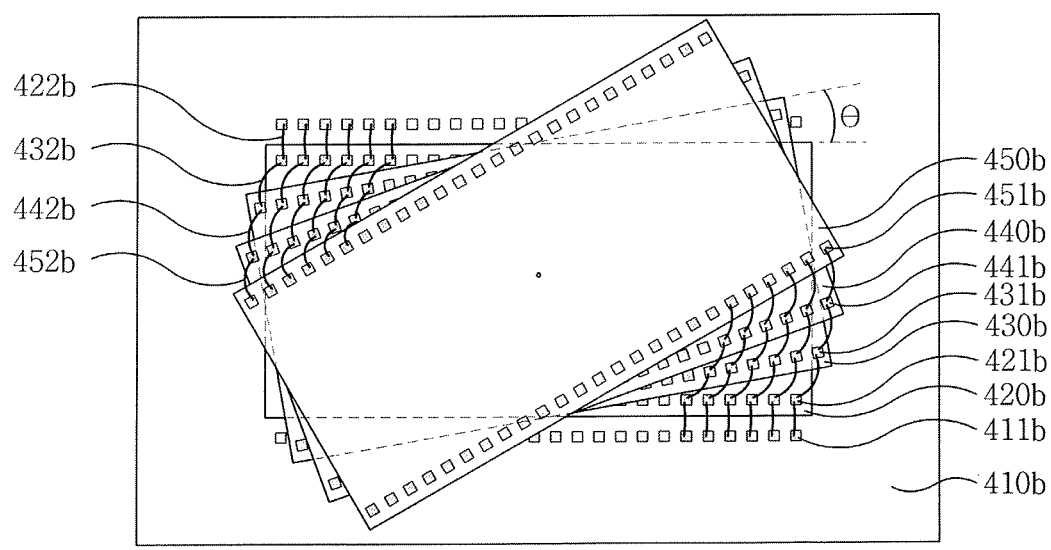
Figure 10:
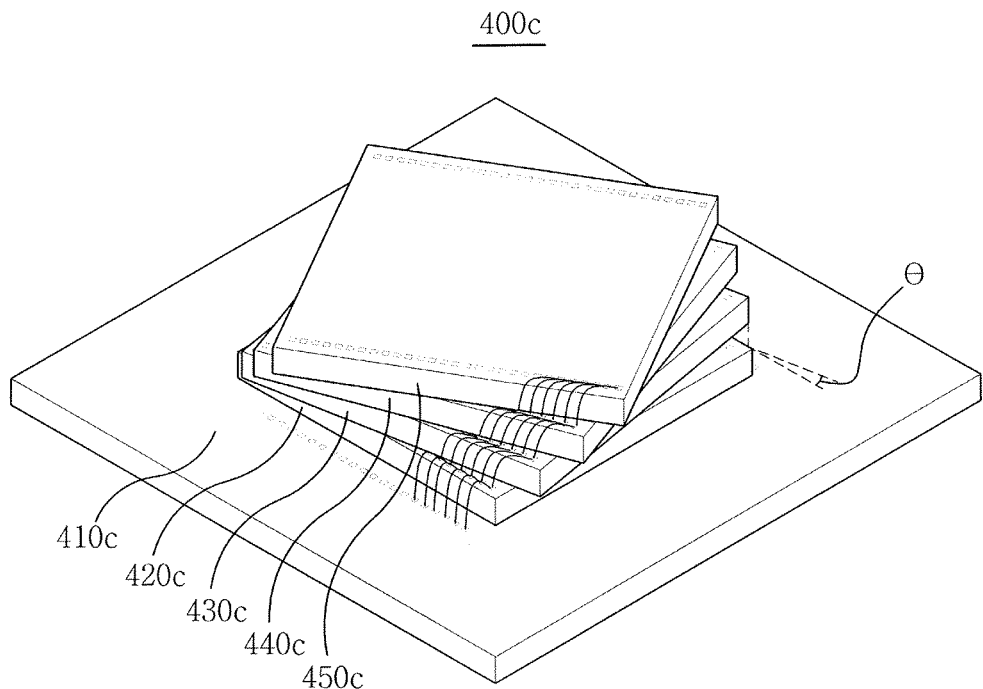
FIG. 10 is a perspective view of a semiconductor package in accordance with embodiments of the inventive concept.

FIGS. 8 and 9 are plan views of semiconductor packages according to another embodiment of the inventive concept. FIG. 10 is a perspective view of a semiconductor package according to another embodiment of the inventive concept.

Referring to FIGS. 8 and 9, semiconductor packages 400a and 400b include substrates 410a and 401b and a plurality of semiconductor chips 420a, 430a, 440a, 450a, 420b, 430b, 440b, and 450b, respectively. The semiconductor chips 420a, 430a, 440a, 450a, 420b, 430b, 440b, and 450b are rotated about rotation axes, for example, virtual center axes connecting the respective centers of the semiconductor chips to be stacked. The number of the stacked semiconductor chips may be 16 or 32, but it is not limited thereto. 32 or more semiconductor chips may be stacked according to spin stacking of the inventive concept.

The semiconductor chips 420a and 420b which are stacked adjacent to the substrate 410a and 410b may be stacked parallel to the substrates 410a and 410b, respectively. The semiconductor chips 430a, 440a, 450a, 430b, 440b, and 450b which are stacked on the semiconductor chips 420a and 420b stacked adjacent to the substrate 410 may be rotated with respect to the rotation axes, for example, virtual center axes connecting the respective centers of the semiconductor chips to be stacked.

The respective semiconductor chips 420a, 430a, 440a, 450a, 420b, 430b, 440b, and 450b may be rotated in a clockwise or counterclockwise direction to be stacked. Internal angles formed by longitudinal directions of the respective semiconductor chips 420a, 430a, 440a, 450a, 420b, 430b, 440b, and 450b may exceed 0 (zero) degrees and be 45 degrees or less. On the other hand, all of the internal angles θ may be identical.

However, the number of chip pads required for electrical connection may differ according to demand for the electrical connection of the semiconductor chips 420a, 430a, 440a, 450a, 420b, 430b, 440b, and 450b, for example, according to the kinds of semiconductor chips and requirements or differences in memory capacity, speed, etc. The spin stacking of the semiconductor chips 420a, 430a, 440a, 450a, 420b, 430b, 440b, and 450b is to expose the chip pads of the respective semiconductor chips 420a, 430a, 440a, 450a, 420b, 430b, 440b, and 450b. As described above, the number of the chip pads required for the electrical connection may be different in each of the semiconductor chips. Accordingly, the number of exposed chip pads may be controlled by adjusting the internal angles θ formed by the longitudinal directions of the respective semiconductor chips 420a, 430a, 440a, 450a, 420b, 430b, 440b, and 450b. In this case, the internal angles θ may differ from each other.

Four exposed portions are formed according to spin stacking of the semiconductor chips 420a, 430a, 440a, 450a, 420b, 430b, 440b, and 450b. The substrates 410a and 410b include a plurality of substrate pads 411a and 411b disposed along edges (or corners) thereof. Exposed portions which expose a number of chip pads disposed on lengthwise edges of upper surfaces of the semiconductor chips 420a, 430a, 440a, 450a, 420b, 430b, 440b, and 450b are referred to as lengthwise exposed portions. Accordingly, two lengthwise exposed portions are formed by spin stacking of the semiconductor chips 420a, 430a, 440a, 450a, 420b, 430b, 440b, and 450b. FIG. 8 illustrates that bonding wires 422a, 432a, 442a, and 452a are disposed on one exposed portion of the four lengthwise exposed portions, and FIG. 9 illustrates that bonding wires 422b, 432b, 442b and 452b are disposed on at least two exposed portions of the four lengthwise exposed portions.

If the semiconductor package requires a relatively large number of chip pads 421a, 431a, 441a, 451a, 421b, 431b, 441b, and 451b for electrical connection, wire bonding may be formed using at least two lengthwise exposed portions as illustrated in FIG. 9. If the semiconductor package requires a relatively small number of the chip pads 421a, 431a, 441a, 451a, 421b, 431b, 441b, and 451b for electrical connection, wire bonding is formed using one lengthwise exposed portion as illustrated in FIG. 8.

On the other hand, although FIGS. 8 and 9 illustrate that the semiconductor chips 420, 430, 440, and 450 having all the same size are stacked, the inventive concept is not limited thereto. There is no limit to which the semiconductor chips may be stacked by spin stacking or to which the chip pads required for electrical connection may be exposed by spin stacking.

FIG. 10 illustrates a semiconductor package 400c in which semiconductor chips 420c, 430c, 440c, and 450c have a cube shape instead of a rectangular parallelepiped shape. The semiconductor chips 420c, 430c, 440c, and 450c are sequentially rotated to be stacked. The case where internal angles formed by longitudinal directions of the respective semiconductor chips 420c, 430c, 440c, and 450c are the same as θ is illustrated. In this case, the spin stacking principal is almost the same as the above embodiments and thus will be omitted.

Figure 12:
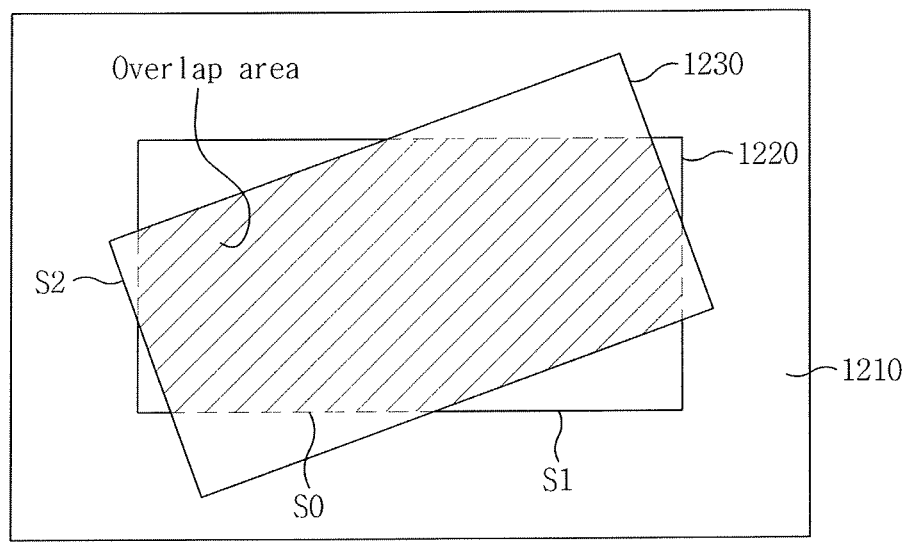
FIG. 12 is a view illustrating an overlap area between first and second semiconductor chips in a semiconductor package according to an embodiment of the present general inventive concept.

FIG. 12 is a view illustrating an overlap area between first and second semiconductor chips 1220 and 1230 in a semiconductor package 1200 according to an embodiment of the present general inventive concept. Referring to FIG. 12, the semiconductor package 1220 includes a substrate 1210, a first semiconductor chip 1220 disposed on the substrate 1210 and having a first shape S1, and a second semiconductor chip 1230 disposed on the first semiconductor chip 1220 having a second shape S2. Here, the first semiconductor chip 1220 and the second semiconductor chip 1230 may have an overlap area So where the second semiconductor chip 1230 is disposed or mounted on the first semiconductor chip 1220. The overlap area So may have a shape different from at least one of the first shape S1 and the second shape S2. For example, the first shape S1 and the second shape S2 may be a rectangular shape or a square (regular quadrilateral) shape, and the shape of the overlap area may be different from the rectangular shape as illustrated in FIG. 12.

The first semiconductor chip 1220 includes first pads, and the second semiconductor chip 1230 includes second pads to be connected to the first pads. The first pads are disposed on an area of the first semiconductor chip 1220 different from the overlap area, and the second pads are disposed on an area of the second semiconductor chip 1230 different from the overlap area.

Figure 13:
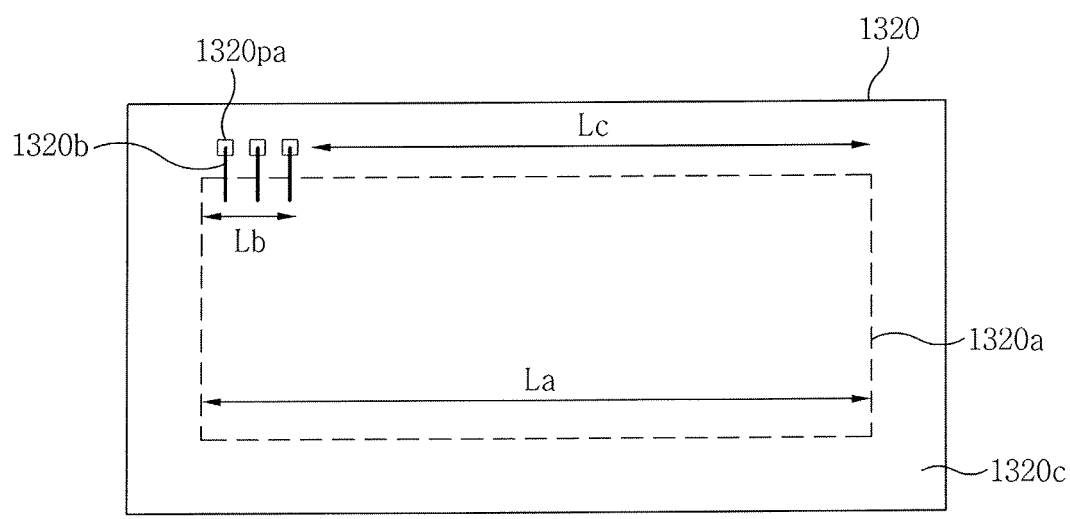
FIG. 13 is a view illustrating a pad area and a non-pad area of a semiconductor chip usable in a semiconductor package according to an embodiment of the present general inventive concept.

FIG. 13 is a view illustrating a pad area and a non-pad area of a semiconductor chip 1320 usable in a semiconductor package according to an embodiment of the present general inventive concept. The semiconductor chip 1320 may have an internal circuit (or memory unit) 1320a, one or more conductive lines 1320b extended from the internal circuit 1320a, and one or more pads 1320pa connected to the corresponding conductive lines 1320b. The semiconductor chip 1320 may further include a molding unit 1320c formed to cover or protect the internal circuit 1320a, the conductive lines 1320b, and the pads 1320pa being exposed to an outside thereof from the molding unit 1320c. The internal circuit 1320a may be disposed to correspond to a length La of the semiconductor chip 1320. The semiconductor chip 1320 may have a pad area corresponding to a length Lb where the pads 1320pa are disposed in a direction to be connected to an outside thereof, for example, another semiconductor chip, a substrate, or an external device. The semiconductor chip 1320 may further include a non-pad area corresponding to a length Lc where no pad is disposed. The length Lb of the pad area may be shorter than the length La of the internal circuit 1320a in the direction. It is possible that the length Lb of the pad area may be shorter than a half of the length La of the internal circuit 1320a in the direction.

Figure 11:
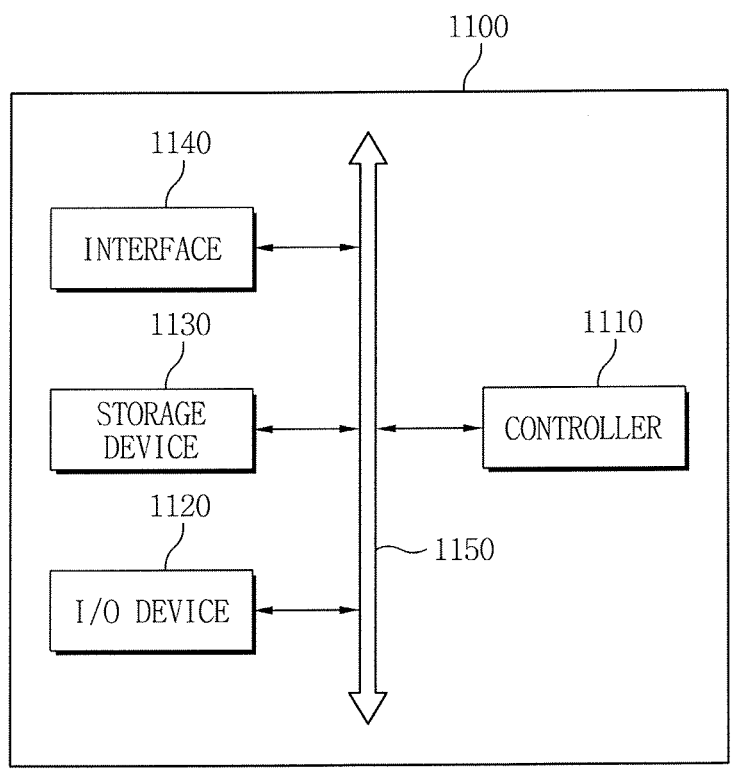
FIG. 11 is a schematic diagram of an electronic system in accordance with embodiments of the inventive concept

FIG. 11 is a construction diagram of an electronic system including a semiconductor package according to an embodiment of the present general inventive concept.

Referring to FIG. 11, an electronic system 1100 according to the embodiment may include a controller 1110, an input/output (I/O) device 1120, a storage device 1130, an interface 1140 and a bus structure 1150. The storage device 1130 may include semiconductor packages 100, 200, 300, and 400 similar to the semiconductor packages described in FIGS. 1 through 10, 12 and/or 13. The bus structure 1150 may provide a path for communicating data with the controller 1110, the I/O device 1120, the storage device 1130, and the interface 1140.

The controller 1110 may include at least one of at least one microprocessor, a digital signal process, a microcontroller, and logic devices, which can perform a function thereof as a function unit of the electronic system. The I/O device 1120 may include one selected from a keypad, a keyboard, a display device, etc. The storage device 1130 may store data and/or commands to be executed by the controller 1110.

The storage device 1130 may include a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM) or a combination thereof.

The interface 1140 may transmit data to a communication network or receive data from the communication network. The interface 1140 may be a wired/wireless type. For example, the interface 1140 may include an antenna, a wired/wireless transceiver, etc. The electronic system 1100 further includes an application chipset, a camera image processor (CIS), an I/O device, etc.

The electronic system 1100 may be embodied by a mobile system, a personal computer, an industrial computer, a logic system which performs various functions, etc. For example, the mobile system may include one of a personal digital assistant (PDA), a portable computer, a web tablet, a mobile phone, a wireless phone, a laptop computer, a memory card, a digital music system and an information transmission/reception system. If the electronic system is a wireless communicable apparatus, the electronic system 1100 may be used in a communication system such as code division multiple access (CDMA), global system for mobile communication (GSM), North American digital cellular (NADC), enhanced-time division Multiple access (E-TDMA), a wideband code division multiple access (WCDAM), and CDMA2000.

According to the inventive concept, an overhang area can be minimized by rotating semiconductor chips in a constant direction to be stacked. In such a structure, a lower semiconductor chip can effectively support an upper semiconductor chip which is directly disposed on the lower semiconductor chip such that pressure applied to the semiconductor chips can be effectively dispersed in a wire bonding process, a molding process, etc. Accordingly, problems such as chip warpage due to stacking of semiconductor chips, chip cracks in wire bonding, etc. can be solved. Furthermore, a structure in which a molding member can be uniformly distributed between chips to minimize unstable molding is provided.

Accordingly, the number of semiconductor chips which are stacked and accommodated can be increased to embody a higher capacity memory. Further, it decreases failures in fabrication of the semiconductor package, thus obtaining excellent production yield and high reliability.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor package, comprising:
   a substrate;
   a first semiconductor chip stacked on the substrate and having a plurality of chip pads disposed on an upper surface of the first semiconductor chip; and
   a second semiconductor chip stacked on the first surface of the first semiconductor chip, having a lower surface to face the upper surface of the second semiconductor chip and having a plurality of chip pads disposed on an upper surface of the second semiconductor chip; and
   an overlap area and a non-overlap area formed between the first semiconductor chip and the second semiconductor chip; and
   wherein the chip pads of the second semiconductor chip are disposed on the overlap area and the non-overlap areas,
   wherein the chip pads of the second semiconductor chip that disposed on the overlap area are electrically connected to the chip pads of the first semiconductor chip, and
   wherein the chip pads of the second semiconductor chip that disposed on the non-overlap areas are not electrically connected to the chip pads of the first semiconductor chip.

2. The semiconductor package according to claim 1, wherein:
   the substrate comprises a plurality of substrate pads; and
   the chip pads of the second semiconductor chip are electrically connected to the chip pads of the first semiconductor chip by first bonding wires and the chip pads of the first semiconductor chip are electrically connected to the substrate pads by second bonding wires.

3. The semiconductor package according to claim 2, wherein the first bonding wires electrically connect the chip pads which are disposed in exposed portions of the first semiconductor chip with the chip pads of the second semiconductor chip.

4. The semiconductor package according to claim 3, wherein the first bonding wires electrically connect the chip pads of the first semiconductor chip disposed in one lengthwise exposed portion of the exposed portions with the chip pads of the second semiconductor chip.

5. The semiconductor package according to claim 3, wherein the first bonding wires electrically connect the chip pads of the first semiconductor chip disposed in two lengthwise exposed portions of the exposed portions with the chip pads of the second semiconductor chip.

6. The semiconductor package of claim 3, wherein the exposed portions of the first semiconductor chip comprise first to fourth exposed portions on first to fourth corners of the first semiconductor chip,
   wherein the chip pads of the first semiconductor chip are disposed on the first and second exposed portions on the first and second corners diagonally facing with each other, and
   wherein the chip pads of the first semiconductor chip are not disposed on the third and fourth exposed portions on the third and fourth corners diagonally facing with each other.

7. The semiconductor package according to claim 1, further comprising:
   a third semiconductor chip stacked on the second semiconductor chip, wherein the third semiconductor chip is rotated to be stacked on a virtual center axis connecting centers of the first to third semiconductor chips as a rotation axis in the same rotation direction as the rotation direction of the second semiconductor chip to be stacked on the first semiconductor chip.

8. The semiconductor package of claim 1, wherein the chip pads of the first semiconductor chip that electrically connected to the chip pads of the second semiconductor chip are disposed on the non-overlap areas of the first semiconductor chip.

9. A semiconductor package, comprising:
a substrate; and
a plurality of semiconductor chips stacked on the substrate,
wherein the plurality of semiconductor chips are rotated with respect to each other about a rotation axis corresponding to a virtual center axis connecting centers of the semiconductor chips, and an overlap area and a non-overlap area formed between one of the semiconductor chip and the other one of the semiconductor chip,
wherein the chip pads of one of the semiconductor chip are disposed on the overlap area and the non-overlap areas,
wherein the chip pads of one of the semiconductor chip that disposed on the overlap area are electrically connected to the chip pads of the other one of semiconductor chip, and
wherein the chip pads of one of the semiconductor chip that disposed on the non-overlap areas are not electrically connected to the chip pads of the other one of the semiconductor chip.

10. The semiconductor package according to claim 9, wherein:
the substrate comprises a plurality of substrate pads; and
the semiconductor chips are electrically connected to the chip pads of the semiconductor chips disposed adjacent to thereto by first bonding wires and the chip pads of a lowest semiconductor chip of the semiconductor chips are electrically connected to the substrate pads by second bonding wires.

11. The semiconductor package according to claim 10, wherein the first bonding wires electronically connect the chip pads disposed in exposed portions of the semiconductor chips.

12. The semiconductor package according to claim 11, wherein the exposed portions comprise one or two lengthwise exposed portions of the exposed portions of each of the semiconductor chips.

13. The semiconductor package of claim 12, wherein the exposed portions of the first semiconductor chip comprise first to fourth exposed portions on first to fourth corners of the first semiconductor chip,
wherein the chip pads of the first semiconductor chip are disposed on the first and second exposed portions on the first and second corners diagonally facing with each other, and
wherein the chip pads of the first semiconductor chip are not disposed on the third and fourth exposed portions on the third and fourth corners diagonally facing with each other.

14. The semiconductor package of claim 9, wherein the chip pads of the first semiconductor chip that electrically connected to the chip pads of the second semiconductor chip are disposed on the non-overlap areas of the first semiconductor chip.

15. A semiconductor package, comprising:
a substrate;
a first semiconductor chip stacked on the substrate and having a first shape; and
a second semiconductor chip stacked on the first semiconductor chip and having a second shape,
wherein an overlap area is formed between the first semiconductor chip and the second semiconductor chip such that a shape of the overlap area has a shape different from the first shape of the first semiconductor chip and the second shape of second semiconductor chip,
wherein the chip pads of the second semiconductor chip are disposed on both of the overlap area and the non-overlap area,
wherein the chip pads of the second semiconductor chip that disposed on the overlap area are electrically connected to the chip pads of the first semiconductor chip, and the chip pads of the second semiconductor chip that disposed on the non-overlap area are not electrically connected to the chip pads of the first semiconductor chip.

16. The semiconductor package of claim 15, wherein the non-overlap area of the first semiconductor chip comprise first to fourth non-overlap area on first to fourth corners of the first semiconductor chip;
wherein the chip pads of the first semiconductor chip are disposed on the first and second non-overlap areas on the first and second corners diagonally facing with each other; and
wherein the pads of the first semiconductor chip are not disposed on the third and fourth non-overlap areas on the third and fourth corners diagonally facing with each other.

17. The semiconductor package of claim 15, wherein the chip pads of the first semiconductor chip that electrically connected to the chip pads of the second semiconductor chip are disposed on the non-overlap area of the first semiconductor chip.

* * * * *